(12) United States Patent
Klimczak et al.

(10) Patent No.: US 8,981,664 B2
(45) Date of Patent: Mar. 17, 2015

(54) CURRENT LIMITING DEVICE FOR PLASMA POWER SUPPLY

(75) Inventors: Andrzej Klimczak, Warsaw (PL); Rafal Bugyi, Warsaw (PL); Pawel Ozimek, Warsaw (PL)

(73) Assignee: TRUMPF Huettinger Sp. zo. o., Zielonka (PL)

( * ) Notice: Subject to any disclaimer, the term of this patent is extended or adjusted under 35 U.S.C. 154(b) by 567 days.

(21) Appl. No.: 12/339,801

(22) Filed: Dec. 19, 2008

(65) Prior Publication Data

US 2009/0160417 A1  Jun. 25, 2009

(30) Foreign Application Priority Data

Dec. 24, 2007  (EP) .................................. 07025085

(51) Int. Cl.
| | |
|---|---|
| G05F 1/59 | (2006.01) |
| H02H 9/02 | (2006.01) |
| H01J 37/34 | (2006.01) |
| G05F 1/595 | (2006.01) |
| G05F 1/613 | (2006.01) |

(52) U.S. Cl.
CPC ............ *H02H 9/021* (2013.01); *H01J 37/3444* (2013.01); *H01J 37/3467* (2013.01)
USPC ...................... 315/291; 204/298.08

(58) Field of Classification Search
USPC ............ 315/291, 294; 333/99, 17.2; 323/305, 323/312, 317, 909; 204/298.08; 156/345.28, 345.44, 345.1; 118/715, 118/663, 707
See application file for complete search history.

(56) References Cited

U.S. PATENT DOCUMENTS

| | | | | | |
|---|---|---|---|---|---|
| 3,611,433 | A | * | 10/1971 | Erst et al. ...................... | 315/161 |
| 3,913,002 | A | * | 10/1975 | Steigerwald et al. ........... | 363/18 |
| 4,610,775 | A | * | 9/1986 | Phifer ...................... | 204/192.12 |
| 5,065,073 | A | * | 11/1991 | Frus ......................... | 315/209 R |
| 5,192,894 | A | | 3/1993 | Teschner | |
| 5,286,360 | A | * | 2/1994 | Szczyrbowski et al. . | 204/298.08 |
| 5,584,972 | A | * | 12/1996 | Lantsman ................ | 204/192.12 |
| 5,645,698 | A | * | 7/1997 | Okano ..................... | 204/192.12 |
| 5,682,067 | A | * | 10/1997 | Manley et al. ................ | 307/127 |
| 5,708,250 | A | * | 1/1998 | Benjamin et al. ........ | 219/121.58 |
| 5,800,688 | A | * | 9/1998 | Lantsman et al. ....... | 204/298.11 |
| 5,801,489 | A | * | 9/1998 | Chism et al. ............. | 315/111.21 |
| 5,810,982 | A | * | 9/1998 | Sellers .................... | 204/298.08 |
| 5,844,197 | A | * | 12/1998 | Daniel ..................... | 219/121.57 |
| 5,882,492 | A | * | 3/1999 | Manley et al. ........... | 204/298.08 |
| 5,889,391 | A | * | 3/1999 | Coleman ...................... | 323/271 |
| 5,948,215 | A | * | 9/1999 | Lantsman ................ | 204/192.12 |
| 5,990,668 | A | * | 11/1999 | Coleman ...................... | 323/271 |

(Continued)

FOREIGN PATENT DOCUMENTS

| | | |
|---|---|---|
| EP | 0 528 163 | 2/1993 |
| EP | 1 720 195 | 11/2006 |

(Continued)

*Primary Examiner* — Adolf Berhane
*Assistant Examiner* — Nusrat Quddus
(74) *Attorney, Agent, or Firm* — Fish & Richardson P.C.

(57) ABSTRACT

The current ($I_{out}$) flowing between a plasma chamber and a power supply is limited by limiting the current change di/dt if the current exceeds a predetermined current. A current change limiting device is provided in the current path between the power supply and the plasma chamber and is configured to determine if the current exceeds the predetermined current and limits the current change.

25 Claims, 4 Drawing Sheets

(56) References Cited

U.S. PATENT DOCUMENTS

| | | | |
|---|---|---|---|
| 6,001,224 A | 12/1999 | Drummond et al. | |
| 6,096,174 A * | 8/2000 | Teschner et al. | 204/192.12 |
| 6,113,760 A * | 9/2000 | Kuriyama et al. | 204/298.03 |
| 6,365,868 B1 * | 4/2002 | Borowy et al. | 219/121.54 |
| 6,416,638 B1 * | 7/2002 | Kuriyama et al. | 204/298.08 |
| 6,621,674 B1 * | 9/2003 | Zahringer et al. | 361/58 |
| 6,784,858 B2 * | 8/2004 | Awamoto | 345/60 |
| 6,967,305 B2 * | 11/2005 | Sellers | 219/121.54 |
| 8,024,917 B2 * | 9/2011 | Hruby et al. | 60/202 |
| 8,096,276 B2 * | 1/2012 | Aida et al. | 123/143 B |
| 8,222,827 B2 * | 7/2012 | Kuennen et al. | 315/224 |
| 2004/0055881 A1 | 3/2004 | Christie | |
| 2005/0211381 A1 * | 9/2005 | Turner et al. | 156/345.28 |
| 2006/0011473 A1 * | 1/2006 | Kuriyama et al. | 204/298.08 |
| 2006/0278518 A1 * | 12/2006 | Kouznetsov | 204/192.1 |
| 2007/0034498 A1 * | 2/2007 | Ganciu-Petcu et al. | 204/192.1 |
| 2007/0251813 A1 * | 11/2007 | Ilic et al. | 204/192.1 |
| 2009/0008240 A1 * | 1/2009 | Ilic et al. | 204/192.1 |

FOREIGN PATENT DOCUMENTS

| | | |
|---|---|---|
| JP | 2001145371 A | 5/2001 |
| JP | 2002235170 A | 8/2002 |
| JP | 2006500473 A | 1/2006 |
| JP | 2007169730 A | 7/2007 |
| KR | 100501069 | 7/2005 |
| WO | WO 2007/115819 | 10/2007 |

* cited by examiner

CURRENT LIMITING DEVICE FOR PLASMA POWER SUPPLY

CROSS REFERENCE TO RELATED APPLICATION

This application claims priority under 35 U.S.C. §119(a) to EP 07 025 085.7-1231, filed Dec. 24, 2007, which is incorporated herein by reference in its entirety.

TECHNICAL FIELD

The invention relates to a method of limiting a current flowing between a plasma chamber and a power supply.

BACKGROUND

A power supply, which is connected to the substrate potential of a vacuum chamber used for plasma surface treatment (delivering the bias voltage), should be a controlled voltage source. The voltage at the output of the power supply follows the voltage set-point, and is independent from the current, which is drawn. This current depends on the plasma and substrate properties, which may change in time during the treatment process. The velocity and amplitude of these changes may vary significantly, and depend on the geometry and movement (rotation) of the substrate, as well as the momentary amount of ions in the plasma chamber, which changes rapidly especially when a high power impulse magnetron is used. In order to keep the voltage value independent from the load current, a capacitor can be used.

SUMMARY

In one general aspect, the current change of a current ($I_{out}$) flowing between a plasma chamber and a power supply is limited by limiting the current change if the current ($I_{out}$) exceeds a predetermined current with a current change limiting device that is provided in the current path between the power supply and the plasma chamber, and pre-charging an inductor that is provided in the current path between the power supply and the plasma chamber by applying a DC current to the inductor.

Implementations can include one or more of the following features. For example, the power supply can be operated as a voltage source. The current flowing between the plasma chamber and the power supply can be measured. The current flowing through the inductor can be measured. The predetermined current can be selected to be higher than the highest expected normal operation current.

A current limiting set-point can be input to the current change limiting device. The DC current can be controlled based on the current flowing between the plasma chamber and the power supply.

The voltage ($U_{CL}$) across the current change limiting device can be measured. An arc can be detected if the voltage ($U_{CL}$) across the current change limiting device exceeds a predetermined value.

The current path between the power supply and the plasma chamber can be interrupted subsequent to limiting the current change.

In another general aspect, a current change limiting device is provided in a current path between a power supply and a plasma chamber for limiting the current change of a current ($I_{out}$) flowing between the plasma chamber and the power supply. The current change limiting device includes a non-linear device and an inductor that is pre-charged by application of a DC current to the inductor.

Implementations can include one or more of the following features. The power supply can be a voltage source. The current change limiting device can include a current measuring device positioned between the plasma chamber and the power supply to measure the current flowing between the plasma chamber and the power supply. The current change limiting device can include an input for inputting a current limiting set-point. The current change limiting device can include a voltage source or a current source. The non-linear device can include a diode. The current change limiting device can include a diode bridge circuit and an auxiliary power supply connected to the diode bridge circuit, wherein the diode bridge circuit provides the DC current to the inductor.

In another general aspect, a current change limiting arrangement is provided in the current path between a power supply and a plasma chamber. The arrangement includes a direct-reaction circuit configured to limit the current change of a current ($I_{out}$) flowing between the plasma chamber and the power supply if the current ($I_{out}$) exceeds a predetermined current, and an indirect-reaction circuit configured to interrupt the current flow between the power supply and the plasma chamber.

Implementations can include one or more of the following features. For example, the current change limiting arrangement can include a current change limiting device provided in a current path between a power supply and a plasma chamber for limiting the current change of a current ($I_{out}$) flowing between the plasma chamber and the power supply.

The indirect reaction circuit can include a semiconductor switch reactive to a measurement device.

In another general aspect, a vacuum treatment apparatus includes a power supply, a plasma chamber, and a current change limiting device provided in a current path between a power supply and a plasma chamber and configured to limit the current change of a current ($I_{out}$) flowing between the plasma chamber and the power supply. The current change limiting device includes a non-linear device and an inductor that is pre-charged by application of a DC current to the inductor.

The method and device allow limiting the current flowing between a plasma chamber and a power supply.

In one general aspect, a current change di/dt of a current flowing between a plasma chamber and a power supply is limited. if the current flowing between the plasma chamber and the power supply exceeds a predetermined current. A current change limiting device is provided in the current path between the power supply and a plasma chamber and acts to limit the current change and determine if the current exceeds the predetermined current. The current change limiting device can act automatically by itself without a detection circuit and basically without time lapse between detection and resulting action after detection and is therefore very fast, for example, faster than 200 ns.

An inductor, which is provided in the current path between the power supply and the plasma chamber, is pre-charged by applying a DC current to the inductor. Pre-charging the inductor can include adding an additional current to the output current flowing between the plasma chamber and the power supply during normal operation. The additional current can be automatically adjusted such that the sum of the two currents is equal to the predetermined current. If the output current flowing between the plasma chamber and the power supply exceeds the predetermined current, the additional current applied to the inductor can be adjusted automatically, basically without time-delay, such that a lower or no current is added to the current flowing between the plasma chamber and the power supply. In this case, the inductor slows down the current rise of the current flowing between the plasma chamber and the power supply. Thus, an arc detection device has enough time to detect if an arc is present and to switch off a switch provided between the power supply and the plasma chamber in case of detection of an arc.

The current change limiting device can be a non-linear device or can contain one or more non-linear devices.

During normal operation, the current change limiting device is basically transparent to the current flowing between the plasma chamber and the power supply. However, in case of an overload, the current change is limited by the current change limiting device. This can be a limiting down to di/dt≤0A/s, which means that no more current rise is possible. In case of an arc occurring, the current change is also limited by the non-linear device, giving sufficient time for detecting the arc and switching off a serial switch between the plasma chamber and the power supply. The method can be applied to DC power supplies as well as AC power supplies.

Limiting the current change includes slowing down the rising of the current flowing between the plasma chamber and the power supply. The method is applicable to currents flowing from the power supply to the plasma chamber as well as to currents flowing from the plasma chamber to the power supply, which may be operated as a voltage source.

Initially after exceeding the predetermined current, the current change limiting device can be considered as a current static value limiting device. It prevents the current from changing abruptly. Hence, by limiting the current change di/dt, the static value of the current is also limited (almost kept constant), at least initially after the current rises above the predetermined current. The larger the inductivity of the inductance is the smaller is the initial absolute change of the current.

The pre-charging current should constantly flow through the inductor in the same direction as the current supplied by the power supply making the inductor "invisible" for currents up to the predetermined current value and "visible" for higher current values.

From the functional point of view the invention provides two important features. First, the current limitation circuit is activated immediately (that is, with no delay) upon exceeding of the predetermined current, because it is done in a direct-reaction circuit. In other words, the current change limitation is enabled by the value of the current itself. Second, the current limitation circuit brings no effect to the power supply's output parameters if the output current is below the current limit threshold, so a capacitive output behavior of the power supply can remain unchanged and be exposed to the load.

The "direct-reaction" means that a counter-reaction to a parameter change is activated as a direct response to the change of this parameter. In other words, the current limits itself. This provides null reaction time and is important during the first few microseconds in order to gain the time necessary to activate other slower, indirect reaction circuits (deactivate semiconductor switches responsible for providing power to the output). A simple example of a direct reaction can be a resistor connected in series. If the current increases, then the voltage across the resistor increases in a direction, which causes the current to decrease. This happens without time delay. Alternatively, an inductor can be used.

In contrast to a direct-reaction device or circuit, an indirect-reaction device or circuit uses intermediate elements like sensors, controls, drives, and semiconductor switches to detect an excessive state of a parameter and generate the counter-action through activating the switches.

The current change limiting device is disabled by pre-charging the inductor with a current. This current can, for example, flow along a loop consisting of the inductor and a freewheeling-diode circuit. The current is induced and maintained by an auxiliary charging circuit, which incorporates the freewheeling diodes. The inductor does not disturb the power supply output parameters unless the output current reaches the predetermined current value.

The "pre-charge current", "pre-determined current," and "current limit threshold" all refer to the same value in case an inductor-based current change limiting device is used. If a semiconductor device is used, then the first (the "pre-charge current") does not apply, because there is no pre-charge current.

If the current flowing between the plasma chamber and the power supply is measured, one can easily determine whether the current exceeds a predetermined current.

The predetermined current can be selected to be higher than the highest expected normal operation output current, i.e., current output by the power supply. In normal operation, the current change limiting device is transparent for currents of values up to the predetermined current. Thus, the voltage stabilizing features of a capacitor, which can be present between the output terminals of a power supply, can be exposed straight to the output of the power supply.

A current limiting set-point can be input to the current change limiting device. Such a limiting set-point can correspond to the predetermined current, which is higher than the highest expected normal operation output current. By inputting different limiting set-points, the current change limiting device can be adjusted to different applications.

As an alternative to a diode, a semiconductor device with a control input can be used as a non-linear device of the current change limiting device and a voltage or current applied to the control input can be adjusted in order to input a set-point and thus set the predetermined current.

Preferably, the semiconductor device is a semiconductor switch with voltage or current controlled saturation current. The current limiting set-point can be controlled by varying the gate voltage of the semiconductor switch or the current applied to the base of the semiconductor switch. In this case, no separate measurement of the output current of the power supply is needed.

If the voltage across the current change limiting device, in particular, the non-linear device, is measured, the measured voltage can be evaluated in order to detect an arc. A large voltage drop across the non-linear device indicates an arc occurring in the plasma chamber. Thus, an arc is detected if the voltage across the current change limiting device exceeds a predetermined value.

In another general aspect, a current change limiting device limits the current change di/dt of a current flowing between a plasma chamber and a power supply. The current change limiting device is provided in the current path between a power supply and a plasma chamber. The current limiting device is or includes a non-linear device and an inductor, which is pre-charged by applying a DC current to the inductor. The current change limiting device allows achieving a very good voltage stability of a power supply, which can be a voltage source, regardless of the load impedance deviation. The inductor can be used to slow down the current rise of the output current.

In case the output of the power supply is shorted, the energy transferred into the short circuit can be very low. This qualifies the current limiting device to be used as a bias voltage source, especially in high power impulse magnetron sputtering (HIPIMS). This is a sputtering method in which relatively high power impulses with short duration are applied to the cathodes of the magnetron sputtering system. By doing this, the disadvantage of a low degree of ionization from the sputtered target can be overcome.

A measuring device can be provided for measuring the current flowing between the plasma chamber and the power supply. The measured current can be used to control the non-linear device.

The current change limiting device can have an input for inputting a current limiting set-point. Thus, depending on the plasma process, different current limiting set-points can be set by a user.

The current change limiting device can include a voltage source or a current source. The voltage source or current source can be used to control the non-linear device according to a predetermined current limiting set-point. The non-linear device can thus be controlled in a way to be basically transparent to currents if the current is below the current limiting set-point and to limit the current if the current is above the current limiting set-point.

The DC current applied to the inductor can be provided by a bridge circuit connected to an auxiliary power supply. The bridge circuit can be a or a part of a current source. The auxiliary power supply can be a switch mode power supply having an output transformer, where the secondary winding of the output transformer can be connected to the bridge circuit, which can be a diode bridge circuit. The output transformer provides an AC voltage, which is rectified by the bridge circuit. The use of a diode bridge circuit has the further advantage that the bridge circuit can be used as a freewheeling diode in order to keep the freewheeling current away from the arc discharge.

The output voltage provided by the auxiliary power supply can be controlled in dependence on the measured current between the plasma chamber and the power supply.

In an alternative embodiment, the current change limiting device can include a semiconductor device with a control input. The control input can either be a gate connection or a base connection of a semiconductor device. The semiconductor device can be embodied as a semiconductor switch with a voltage or current controlled saturation current. By using such a semiconductor device as a current change limiting device, the current flowing between the plasma chamber and the power supply can be forced to not exceed the predetermined current.

A voltage source or a current source can be connected to the control input of the semiconductor device in order to control the semiconductor device in accordance with a predetermined current limiting set-point.

In another general aspect, a current change limiting arrangement is provided in the current path between a power supply and a plasma chamber. The arrangement includes a direct-reaction circuit, which limits the current change di/dt of the current flowing between the plasma chamber and the power supply if the current exceeds a predetermined current; and an indirect-reaction circuit, which interrupts the current flow between the power supply and the plasma chamber. Direct-reaction circuit means that a counter-reaction to a parameter change is activated as a direct response to the change of this parameter. An indirect-reaction circuit uses intermediate elements like sensors, controls, drives, and semiconductor switches to detect an excessive state of a parameter and generate the counter-action through activating the switches.

The current change limiting arrangement can be used to achieve several advantages. For example, the current change limiting arrangement provides improved or optimum voltage stability at extremely high load variations. As another example, the current change limiting arrangement provides low or lower arc energy when short circuit (arc) occurs.

One possibility to provide the high dynamic voltage stability feature is to use a large capacitor at output of the power supply.

The second advantage can be achieved by using a fast short-circuit detector and a fast switch-off element. The problem however arises when considering the possible reaction times of the detection and switch-off circuits. Previously, it was possible to provide reliable reaction times within 2-3 µs. If an output voltage of 1200V is present at the output capacitor and, e.g., 2 meters of cable are used, a current change of approximately di/dt=800 A/µs occurs in case of an arc. This means that in 2-3 µs the current may exceed 2000 A and the energy stored in the cables exceed 3 J. The invention allows switching off of this current sooner by using a current (change) limiting device in the first stage of the switch-off process. The current can thus be limited for just a few microseconds. More particularly, an inductor can be used if the di/dt over this short time gives insignificant current change compared to the current just before the arc occurred. If the current (change) is limited for this time, a slower, indirect switch-off circuit can be used to complete the switch-off.

The current change limiting arrangement can include an inventive current change limiting device.

The indirect reaction circuit can include a semiconductor switch reactive to a measurement device.

In another general aspect, a vacuum treatment apparatus includes a power supply, a plasma chamber, and a current change limiting device.

The details of one or more embodiments of the invention are set forth in the accompanying drawings and the description below. Other features and advantages of the invention will be apparent from the description and drawings, and from the claims.

DETAILED DESCRIPTION

Figure 1:
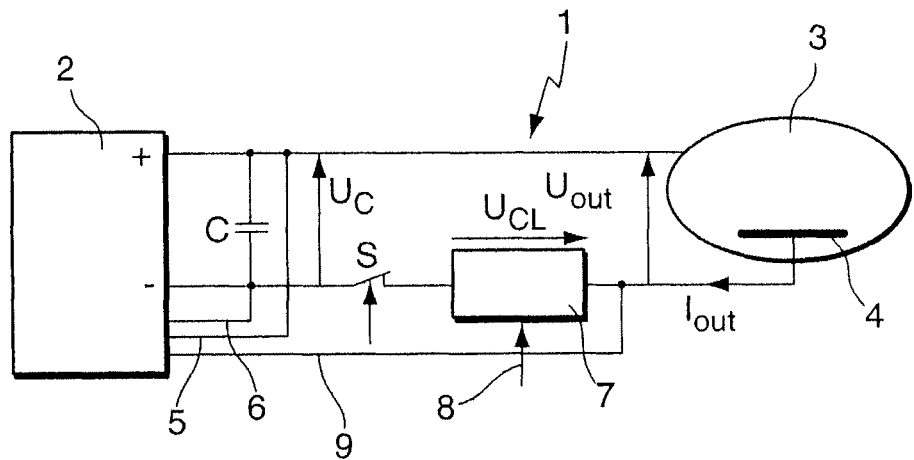
FIG. 1 is a schematic diagram of a vacuum treatment apparatus having a current change limiting device.

FIG. 1 shows a vacuum treatment apparatus 1, having a power supply 2, which is embodied as DC power supply in the present embodiment, and a plasma chamber 3. In the plasma chamber 3 a substrate 4 is located. In the present embodiment the power supply 2 is used as a bias power supply. Thus, the power supply 2 applies a negative potential to the substrate 4, whereas the positive potential (having an output voltage $U_{out}$) of the power supply 2 is connected to the plasma chamber 3, which is connected to a reference potential, in particular, ground potential. In order to keep the voltage $U_{out}$ applied to the plasma chamber 3 as constant as possible, a capacitor C is provided. So the DC power supply operates as a voltage source. To enable control of the capacitor voltage $U_C$ and the output voltage $U_{out}$, a voltage feedback indicated by lines 5, 6, 9 is provided to the power supply 2.

The current flowing between the plasma chamber 3 and the power supply 2 is indicated by $I_{out}$. This current flows into a current change limiting device 7, which is or includes a non-linear device. If the current $I_{out}$ is below a predetermined current, the current change limiting device 7 takes no action or remains inactive. However, if the current $I_{out}$ rises to or above the predetermined current, the current change limiting device 7 becomes active and limits the current change di/dt and thus the current $I_{out}$ flowing from or to the power supply 2. At the same time, the voltage $U_{CL}$ across the current change limiting device 7 rises. This implies that the voltage $U_{out}$ is decreased to a value, which is determined by the U/I characteristic of the load, which in this case, is the plasma in the chamber 3. The voltage across the current change limiting device is: $U_{CL}=U_C-U_{out}$.

The current change limiting device 7 has an input 8, through which a current limiting set-point can be input to the current change limiting device 7. Also in the current path between the plasma chamber 3 and the power supply 2 is provided a device, in particular, a switch S, that can be switched off, i.e., opened, or can be forced to change its impedance from a low level to a high level, if an arc is detected.

Figure 2A:
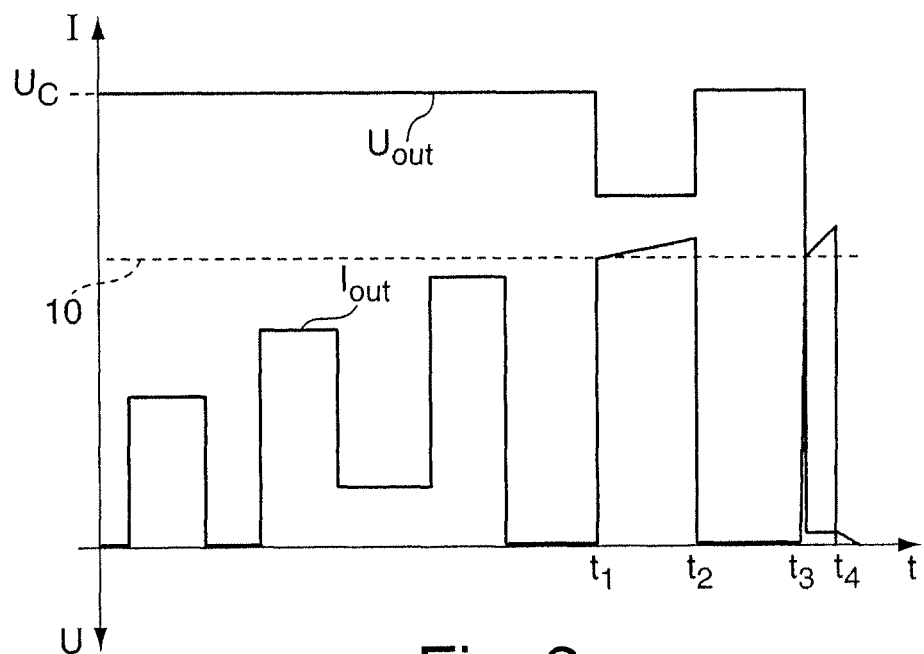
FIG. 2a is a graph of the voltage and current waveforms at the output of a power supply of the vacuum treatment apparatus of FIG. 1.

FIG. 2a shows the voltage and current characteristic of the voltage $U_{out}$ and the current $I_{out}$ indicated in FIG. 1. During normal operation, the output current $I_{out}$ stays below the predetermined current defined by the current limiting set-point, which is indicated by the dashed line 10. If, at time $t_1$, an overload occurs, the output current $I_{out}$ rises above the current defined by the current limiting set-point. This results in a drop in the absolute value (magnitude) of the output voltage $U_{out}$ because there is a voltage rise across the current change limiting device 7. The current change limiting device 7 limits the rising of the output current $I_{out}$ in that the output current $I_{out}$ only rises relatively slowly up to point $t_2$.

At point $t_3$, the output current $I_{out}$ rises above the predetermined current due to an arc. This also results in a voltage drop in the magnitude of the voltage $U_{out}$. Again, the current change limiting device 7 has the effect of slowing down the current rise between times $t_3$ and $t_4$.

The absolute value (magnitude) of $U_{CL}$ is high (over 50% of $U_C$) between times $t_3$ and $t_4$. This can be an indication of an arc event. At time $t_4$, switch S is opened and no more current flows to or from the power supply 2 (therefore, $I_{out}$ drops to 0 A).

Figure 3A:
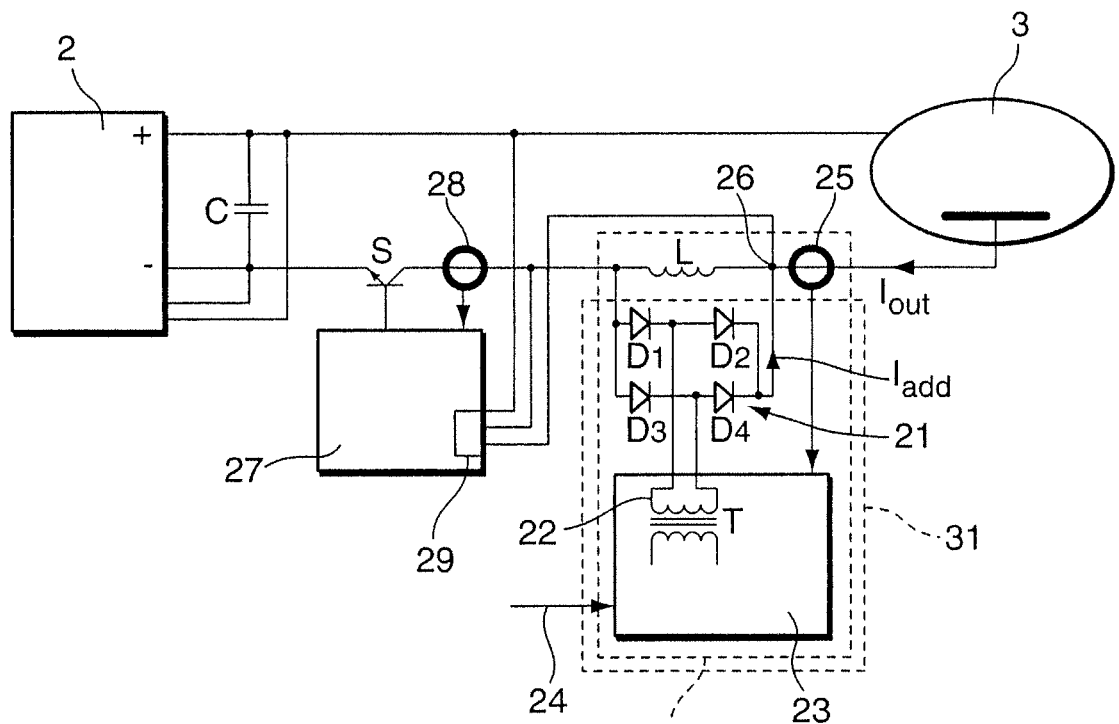
FIG. 3a is a schematic diagram of a vacuum treatment apparatus having a first embodiment of a current change limiting device.

FIG. 3a shows a first embodiment of a current change limiting device 20. In this embodiment, the current change limiting device 20 includes an inductor L, which has a current applied to it by a current source 31, which is embodied by an auxiliary power supply 23, an output transformer T, and a bridge circuit 21 including four diodes D1-D4.

The inductor L is pre-charged by application of a DC current $I_{add}$ from the bridge circuit 21 to the inductor L. Thus, if needed, that s, if the current $I_{out}$ becomes too high, the inductor L can be used to slow down the current rise of the current $I_{out}$, as described in greater detail below.

The bridge circuit 21 is connected to the secondary winding 22 of the output transformer T of the auxiliary power supply 23. The auxiliary power supply 23 can be embodied as a switch mode power supply. The auxiliary power supply 23 gets as an input a current limiting set-point, which is indicated by arrow 24. The output transformer T provides an AC voltage, which is rectified by the bridge circuit 21 into a DC voltage and current. A current measurement means 25 for measuring the current through inductor L is connected to the auxiliary power supply 23. The current measurement means 25 is placed inside the current loop (that includes the inductor L and the diodes D1-D4) and is used by the auxiliary power supply 23 to maintain the inductor's pre-charge current value at the pre-determined level (which is the current limiting set-point).

For the circuit shown in FIG. 3a, the following equations apply:

$$I_L = I_{out} + I_{add} \text{ (because of the circuit topology)} \quad (01)$$

so $$I_{MAX} = I_{out} + I_{add} \quad (02)$$

and $$I_{out} = I_{MAX} - I_{add} \quad (03)$$

and also $$I_{add} = I_{MAX} - I_{out} \quad (04)$$

but $$I_{add} >= 0 \quad (05),$$

where $I_L$ is the current through the inductor L and $I_{add}$ is the current output by the bridge circuit 21 that is added to the output current $I_{out}$ flowing between the plasma chamber 3 and the power supply 2 during normal operation. $I_{add}$ is 0 or greater because it is the current at the output of the diodes D1-D4 of the bridge circuit 21. In general, $I_{MAX}$ is the maximum current allowed and is also the current flowing through the inductor L during normal operation. Generally, if $I_{out}$ is below $I_{MAX}$, then $I_{add}$ is added to keep the current at $I_{MAX}$. If $I_{out}$ tries to exceed $I_{MAX}$, then $I_{add}$ is zero and the current rise is limited so the current through the inductor L doesn't exceed $I_{MAX}$ or only slowly increases over $I_{MAX}$, so there is enough time for countermeasures before $I_{out}$ increases too much over $I_{MAX}$.

The auxiliary power supply 23 keeps the inductor current $I_L$ at or close to the $I_{MAX}$ level so $I_L = I_{MAX}$. We can call this a freewheeled-current-source limiter. The current distribution between $I_{out}$ and $I_{add}$ depends only on the load conditions. $I_{out}$ can change freely, but only up to $I_{MAX}$ because $I_{add}$ must be positive (equations 04 and 05).

If we assume that during dynamic situations in short-time scale $I_L$ cannot change (inertia of the current in the inductor), then, as soon as $I_{out}$ reaches $I_L$ ($=I_{MAX}$), $I_{add}$ reaches 0 (equation 04), so $I_{out} = I_{MAX}$ (equation 03) and only very slow further increase of $I_{out}$ is possible. This shows that if we consider diodes D1-D4 as ideal elements, then the current limiter operation is based on the topology of the circuit only (arithmetic equations) and is not dependent on any delays.

In this case, the inductor L, because the current through inductor L cannot change very quickly, limits the current rise of the current $I_{out}$. Thus, an arc detection circuit 27, which is connected to a current sensor 28 and has a voltage sensor 29 has enough time to detect an arc and, in case of detection of an arc, to open switch S, in order to prevent the capacitor C from discharging and feeding the arc in the plasma chamber 3. The current sensor 28 measures the current between the plasma chamber 3 and the power supply 2.

Figure 2B:
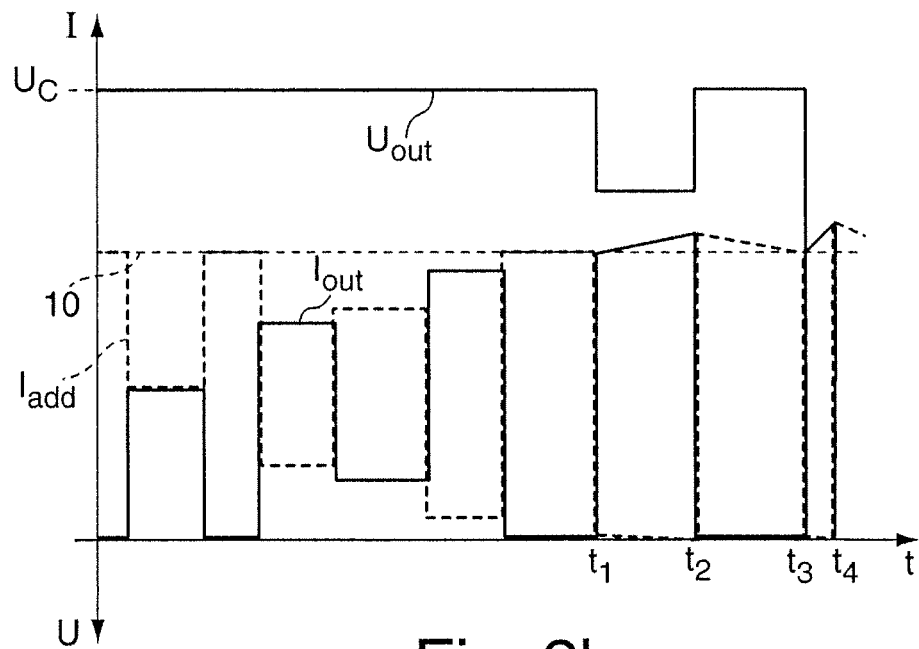
FIG. 2b is a graph that shows the voltage and current waveforms of FIG. 2a and the current $I_{add}$.

This behavior becomes clearer by considering FIG. 2b. If $I_{out}$ is zero, then $I_{add}$ is equal to the current limiting set-point (dashed line 10). If $I_{out}$ is equal to the current limiting set-point, then $I_{add}$ is zero. If $I_{out}$ tries to get higher than the current limiting set-point (for example, between $t_1$ and $t_2$), then $I_{add}$ must go to negative and this is prohibited by the diodes D1-D4. So the delay time is the reverse recovery time of the diodes and thus diodes with very low reverse recovery time are used so that this effect is negligible. Fast silicon diodes such as SKKD150F12 having recovery times of 180 ns may be sufficient but modern SiC diodes can also be used because they are considered to have no reverse current— negligible switch-off times, so actually achieving "null time" is possible today. Diodes are used to limit the current. The diodes work also as freewheeling diodes.

Figure 3B:
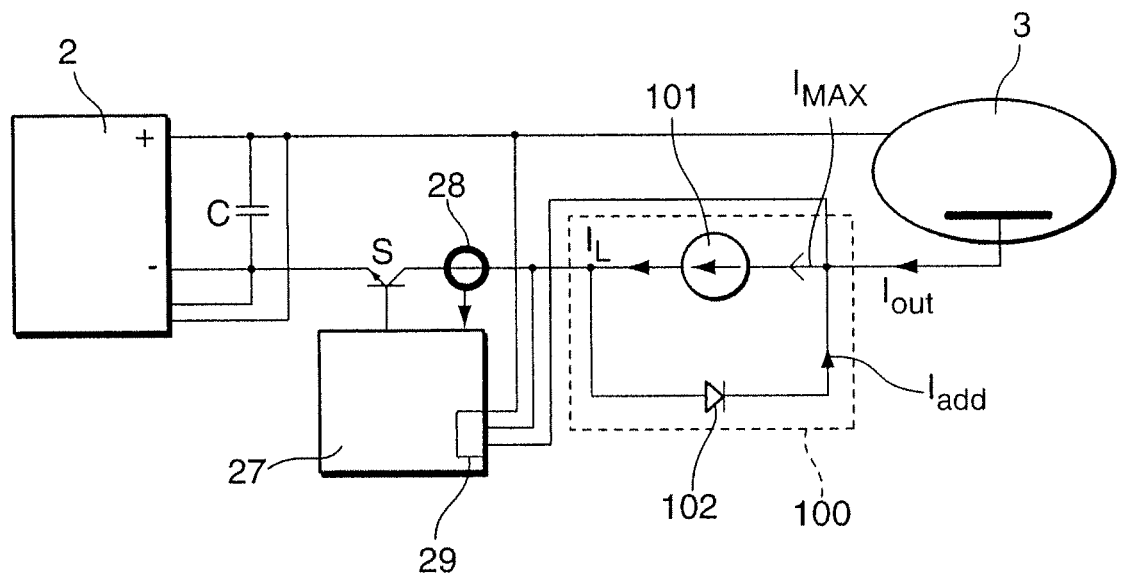
FIG. 3b is a simplified representation of a vacuum treatment apparatus.

FIG. 3b shows a simplified current change limiting device 100, which includes a current source 101 and a diode 102. An ideal current source allows only its own current to pass, and no more or no less.

Figure 4:
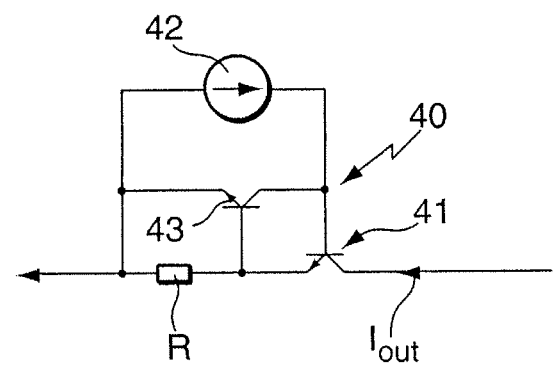
FIG. 4 is a schematic diagram of a second embodiment of a current change limiting device that can be used in the vacuum treatment apparatus.

FIG. 4 shows an alternative embodiment of the current change limiting device 40. The current change limiting device 40 includes a semiconductor device 41 that is connected in series between the plasma chamber 3 and the power supply 2. A current source 42 is connected to the emitter and collector of an auxiliary semiconductor device 43, embodied as a bipolar transistor, the base of which is connected between the emitter of the semiconductor device 41 and a feedback resistor R. This configuration allows setting of the current supplied to the base of the semiconductor device 41. In normal operation, the current source 42 feeds the base of the semiconductor device 41 and keeps it in a low impedance state between the collector and the emitter, so that the current $I_{out}$ can flow with no limitation. The current $I_{out}$ generates a voltage $U_R$ across the resistor R. If the voltage $U_R$ rises above a base-emitter-threshold value of the auxiliary semiconductor device 43, then the auxiliary semiconductor device 43 becomes conductive, and the current from current source 42 flows directly through the auxiliary semiconductor device 43 and no longer through the base and emitter of semiconductor device 41. This will also limit the current rise of $I_{out}$ because the semiconductor device 41 changes to a higher impedance state. The current limiting set-point can be set by the choice of the resistance value of the resistor R. If the resistor R has a controllable impedance, the current limiting set-point can be controlled. The semiconductor device 41 and the auxiliary semiconductor device 43 can each be a bipolar transistor. Then, the current limiting device 40 is easy to realize.

Figure 5A:
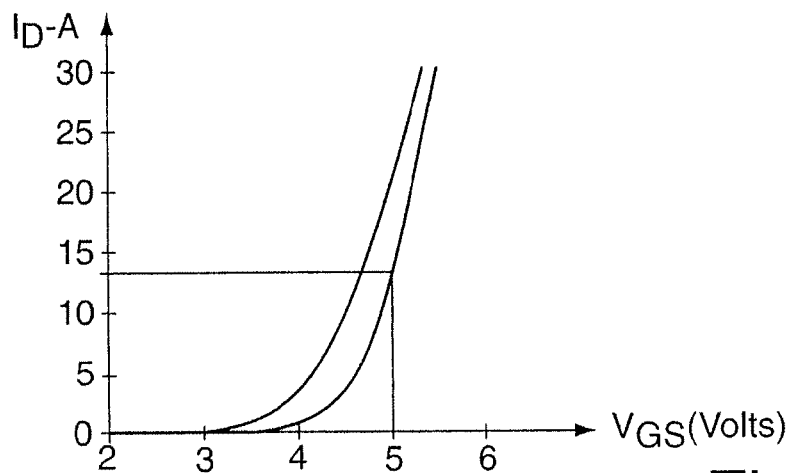
FIG. 5a is a graph of a transfer characteristic of a MOSFET switch that can be used as a component of or as a current change limiting device.

FIG. 5a shows an example of a transfer characteristic of a metal-oxide-semiconductor field-effect transistor (MOSFET) switch that can be used as a current change limiting device or as a component of a current change limiting device. A MOSFET switch is a voltage-controlled semiconductor device. Up to a predetermined current, the MOSFET does not limit the current flowing through the MOSFET. If the current tries to exceed a predetermined current, the current is limited to the predetermined current. In the example shown, an auxiliary voltage source can be used to apply a voltage of for example 5V to the gate of the MOSFET in order to set a saturation current of approximately 13 A.

Figure 5B:
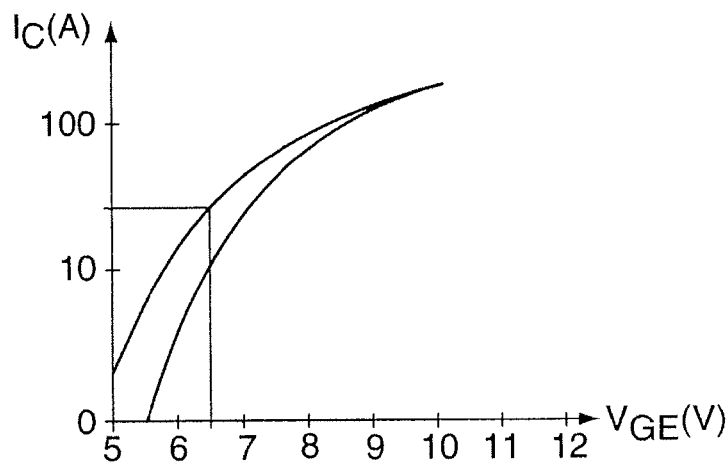
FIG. 5b is a graph of a transfer characteristic of an IGBT switch that can be used as a component of or as a current change limiting device.

FIG. 5b shows an example of a transfer characteristic of an insulated-gate bipolar transistor (IGBT), which is a voltage-controlled bipolar semiconductor device, and can be used as a current change limiting device or as a component of a current change limiting device. A setting of a voltage of 6.5V at the gate will set the saturation current to 13 A. This implies, that the output current $I_{out}$ is not allowed to rise above 13 A.

Figure 5C:
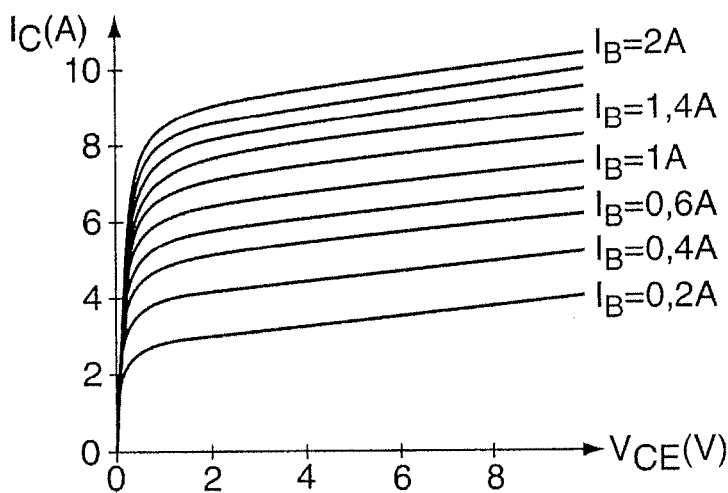
FIG. 5c is a graph of an output characteristic of a bipolar NPN transistor that can be used as a component of or as a current change limiting device.

FIG. 5c shows an example of an output characteristic of a bipolar NPN transistor, which is a current-controlled bipolar semiconductor device, and can be used as a current change limiting device or as a component of a current change limiting device. Feeding a current 1 A to the base of the transistor will set the saturation current to approximately 7 A, which will be the predetermined current, above which the output current is not allowed to rise.

A number of embodiments of the invention have been described. Nevertheless, it will be understood that various modifications may be made without departing from the spirit and scope of the invention. Accordingly, other embodiments are within the scope of the following claims.

What is claimed is:

1. A current change limiting arrangement provided in a current path between a power supply and a plasma chamber, the arrangement comprising:
 a direct-reaction circuit configured to limit the current change of a current ($I_{out}$) flowing between the plasma chamber and the power supply when the current ($I_{out}$) exceeds a predetermined current, wherein the direct-reaction circuit is configured to not limit the current change of the current when the current ($I_{out}$) does not exceed the predetermined current and wherein the predetermined current is selected to be higher than a highest expected normal operation current based on a current output of the power supply; and
 an indirect-reaction circuit configured to interrupt the current flow between the power supply and the plasma chamber.

2. The current change limiting arrangement of claim 1, further comprising a current change limiting device provided in the current path between the power supply and the plasma chamber to limit the current change of the current ($I_{out}$) flowing between the plasma chamber and the power supply, the current change limiting device comprising an auxiliary power supply, a non-linear device, and an inductor that is pre-charged by application of a supplementary DC current from the auxiliary power supply to the inductor.

3. The current change limiting arrangement of claim 2, wherein the indirect reaction circuit includes a semiconductor switch reactive to a measurement device.

4. A vacuum treatment apparatus comprising:
 a power supply,
 a plasma chamber, and
 a current change limiting device provided in a current path between the power supply and the plasma chamber, the current change limiting device comprising a non-linear device and an inductor that is configured to be pre-charged by application of a supplemental current to the inductor;
 wherein the current change limiting device is configured to maintain a predetermined current level in the inductor while a current (Iout) flowing between the plasma chamber and the power supply is less than the predetermined current level, and to limit a current change of the current (Iout) by adjusting the supplemental current in response to the current (Iout) exceeding the predetermined current level, the predetermined current level, and wherein the predetermined current is selected to be higher than a highest expected normal operation current that is based on a current output of the power supply.

5. A method of limiting a current change in a current ($I_{out}$) flowing between a plasma chamber and a power supply, the method comprising:
selecting a predetermined current level to be higher than a highest expected normal operation current;
limiting the current change if the current (Iout) exceeds the predetermined current level, by function of a current change limiting device comprising an inductor provided in a current path between the power supply and the plasma chamber; and
maintaining the predetermined current level in the inductor, by supplying a supplemental current (Iadd) to the inductor in response to the current (Iout) being less than the predetermined current level;
wherein the supplemental current is adjusted in response the current (Iout) exceeding the predetermined current level.

6. The method of claim 5, further comprising operating the power supply as a voltage source.

7. The method of claim 5, further comprising measuring the current flowing between the plasma chamber and the power supply.

8. The method of claim 5, further comprising measuring the current flowing through the inductor.

9. The method of claim 5, further comprising inputting a current limiting set-point to the current change limiting device.

10. The method of claim 5, further comprising controlling the supplemental current based on the current flowing between the plasma chamber and the power supply.

11. The method of claim 5, further comprising measuring the voltage ($U_{CL}$) across the current change limiting device.

12. The method of claim 5, further comprising detecting an arc if a voltage ($U_{CL}$) across the current change limiting device exceeds a predetermined value.

13. The method of claim 5, further comprising interrupting the current path between the power supply and the plasma chamber subsequent to limiting the current change.

14. A plasma chamber power supply current change limiting device comprising:
a non-linear device; and
an inductor coupled to the non-linear device and configured to be provided in a current path between a power supply and a plasma chamber;
wherein the current change limiting device is operable to maintain a predetermined current level in the inductor while a current (Iout) flowing between the plasma chamber and the power supply is less than the predetermined current level, and to limit a current change of the current (Iout) in response to the current (Iout) exceeding the predetermined current level, by adjusting a supplemental current (Iadd) provided to the inductor, wherein the predetermined current is selected to be higher than a highest normal operation current.

15. The plasma chamber power supply current change limiting device of claim 14, wherein the power supply is a voltage source.

16. The plasma chamber power supply current change limiting device of claim 14, further comprising a current measuring device configured to be positioned between the plasma chamber and the power supply to measure the current flowing between the plasma chamber and the power supply.

17. The plasma chamber power supply current change limiting device of claim 14, further comprising an input for inputting a current limiting set-point.

18. The plasma chamber power supply current change limiting device of claim 14, further comprising a voltage source or a current source.

19. The plasma chamber power supply current change limiting device of claim 14, wherein the non-linear device includes a diode.

20. The plasma chamber power supply current change limiting device of claim 14, further comprising a diode bridge circuit and an auxiliary power supply connected to the diode bridge circuit, wherein the diode bridge circuit provides the supplemental current to the inductor.

21. The vacuum treatment apparatus of claim 4, the current change limiting device comprising a current source configured to supply the supplemental current to the inductor.

22. The vacuum treatment apparatus of claim 21, the current source comprising an auxiliary power supply coupled to a current measurement device configured to measure the current in the inductor, wherein the auxiliary power supply is configured to use the measured current to maintain the predetermined current level in the current.

23. The vacuum treatment apparatus of claim 22, wherein the auxiliary power supply is coupled to an output transformer, and wherein output transformer is coupled to the inductor by a bridge circuit of one or more diodes.

24. The vacuum treatment apparatus of claim 22, wherein the auxiliary power supply is configured to supply the supplemental current to the inductor when the current (Iout) flowing between the plasma chamber and the power supply is less than the predetermined current level, and wherein the auxiliary power supply is configured to cease supplying the supplemental current to the inductor in response to the current (Iout) exceeding the predetermined current level.

25. The vacuum treatment apparatus of claim 24, wherein the auxiliary power supply is configured to supply the supplemental current to the inductor when the current (Iout) flowing between the plasma chamber and the power supply is less than the predetermined current level by setting the supplemental current to the difference between the predetermined current level and the measure current from the current measurement device.

* * * * *

UNITED STATES PATENT AND TRADEMARK OFFICE
CERTIFICATE OF CORRECTION

PATENT NO.        : 8,981,664 B2
APPLICATION NO.   : 12/339801
DATED             : March 17, 2015
INVENTOR(S)       : Andrzej Klimczak, Rafal Bugyi and Pawel Ozimek It is certified that error appears in the above-identified patent and that said Letters Patent is hereby corrected as shown below:

In the Claims

At column 10, line 31 (Claim 1, line 31), delete "current and wherein" and insert --current, and wherein--.

Signed and Sealed this
Thirtieth Day of June, 2015

Michelle K. Lee
*Director of the United States Patent and Trademark Office*